United States Patent
Ellis

[11] 3,956,745
[45] May 11, 1976

[54] PROGRAMMABLE KEYBOARD ARRANGEMENTS

[75] Inventor: Alfred Brian Edwin Ellis, Chelmsford, England

[73] Assignee: The Marconi Company Limited, Chelmsford, England

[22] Filed: June 12, 1974

[21] Appl. No.: 478,612

Related U.S. Application Data

[63] Continuation of Ser. No. 309,129, Nov. 24, 1972, abandoned.

[30] Foreign Application Priority Data
Dec. 16, 1971 United Kingdom............... 58577/71

[52] U.S. Cl............................. 340/337; 340/166 R; 340/365 R; 350/160 LC
[51] Int. Cl.²............................................ G06F 3/02
[58] Field of Search ............ 340/337, 365 R, 365 P, 340/166 R, 166 EL; 350/160 LC

[56] References Cited
UNITED STATES PATENTS

| | | |
|---|---|---|
| 3,382,588 | 5/1968 | Serrell et al. .............................. 35/9 |
| 3,401,470 | 9/1968 | Gaven........................................ 35/9 |
| 3,482,241 | 12/1969 | Johnson ............................. 340/337 |
| 3,622,224 | 11/1971 | Wysocki et al. ............... 350/160 LC |
| 3,673,327 | 6/1972 | Johnson et al. ................. 340/365 P |
| 3,707,715 | 12/1972 | Perotto............................ 340/365 P |
| 3,735,395 | 5/1973 | Iwabuchi et al. ............... 340/337 X |
| 3,757,322 | 9/1973 | Barkan et al..................... 340/365 C |

*Primary Examiner*—David L. Trafton
*Attorney, Agent, or Firm*—Baldwin, Wight & Brown

[57] ABSTRACT

A programmable keyboard of the kind in which a member presents a plurality of discrete areas to a cooperating probe, each of which areas produces a unique signal when addressed by the probe, is provided with a liquid crystal display to identify the current function of a particular area. Separate additional addressable areas are provided by means of which one of a number of alternative display functions can be selected as desired.

8 Claims, 1 Drawing Figure

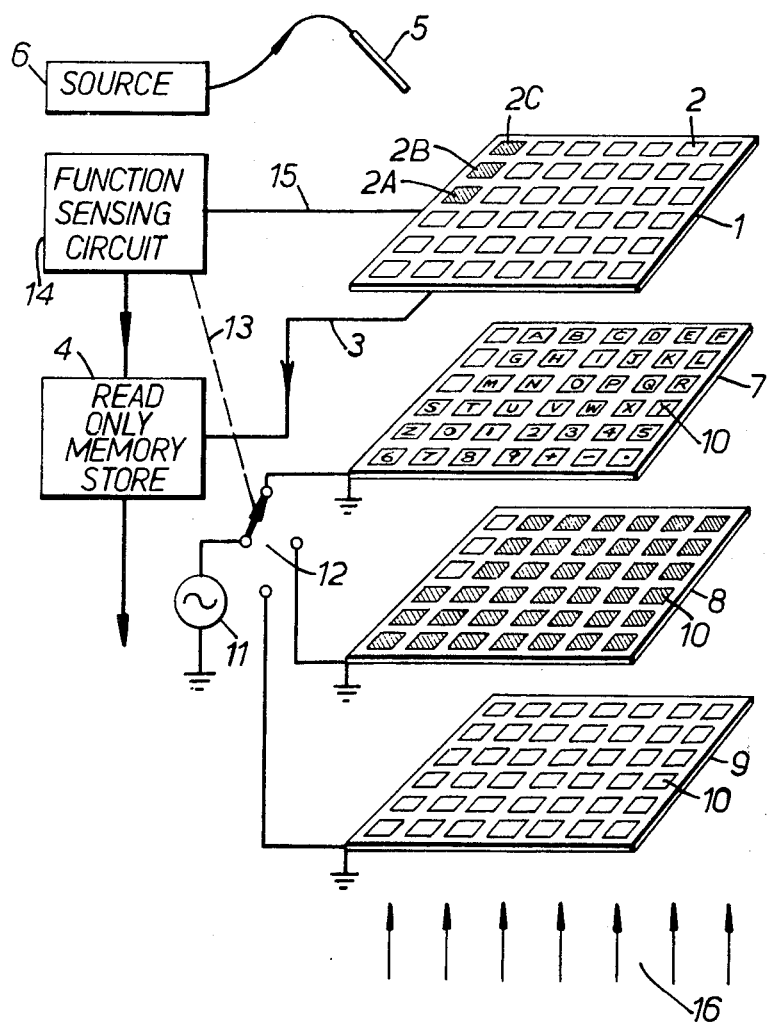

PROGRAMMABLE KEYBOARD ARRANGEMENTS

This is a continuation of application Ser. No. 309,129 filed Nov. 24, 1972, now abandoned.

BACKGROUND OF THE INVENTION

This invention relates to programmable keyboard arrangements and more particularly to such arrangements in which a member is provided which presents a plurality of discrete areas to a cooperating probe, each of which areas is arranged to produce a unique output signal when addressed by said probe.

Programmable keyboard arrangements are often required in which the effective labelling of the "keys" and the code signal resulting from operating a given "key" are changed. The same "keyboard" may, for example, be required at one time to be operable as a typewriter type keyboard, whilst on another occasion be operated to effect a number of control actions in dependence on the "key" activated, whilst on another occasion be used as a display marker generator, a signal being generated for display on a display screen in a position corresponding to the position of an activated "key". In every case both the labelling of the "key" and the code signal activating that key, require to be changed. Arrangements for achieving this are known which involve the use of touch wire displays and also which involve light pen techniques. Such known arrangements, however, tend to be relatively complex.

BRIEF SUMMARY OF THE INVENTION

The present invention seeks to provide an improved programmable keyboard arrangement of relatively simple and reliable construction.

According to this invention a programmable keyboard arrangement of the kind referred to is provided, wherein a number of the discrete areas of said member are light passive and at least two further members providing, when activated, by liquid crystal effect labels for a number of said discrete areas of said first mentioned member, one of said plurality of said discrete areas of said first mentioned member being allocated to control the activation of each of said further members.

Preferably the discrete areas of said first mentioned member which are allocated to control the activation of each of said further members are opaque.

Preferably again the first mentioned and said further members are provided as a sandwich construction, one on another.

Means may be provided for illuminating said members from the rear, through said further members or means may be provided for illuminating said members from the front through said first mentioned member.

Said discrete areas are preferably rectangular and arranged in rows and columns.

BRIEF DESCRIPTION OF THE DRAWING FIGURES

The invention is illustrated in and further described with reference to the accompanying drawing which illustrates in schematic form one programmable keyboard arrangement in accordance with the present invention.

DETAILED DESCRIPTION

Referring to the drawing, a resistive overlay member 1, having a number of defined rectangular areas such as 2, arranged in rows and columns, is arranged to provide an output signal over lead 3 to a read only memory store 4, when any of the areas 2 are addressed by a probe 5, energised by source 6. The signal provided on lead 3 identifies the area 2 which has been addressed by the probe 5 in conventional fashion. All but three of the areas 2 in member 1 are transparent. The three non transparent areas referenced 2a, 2b and 2c bear permanent labels, each of which identifies a different function required of the "keyboard". In the present case these labels are assumed to be for area 2a "characters", for area 2b "control commands" and for area 2c "marker position".

Immediately beneath member 1 are three further members 7, 8 and 9, each of these further members 7, 8 and 9 consists of areas such as 10, containing individual liquid crystal display cells. The first mentioned layer 1 and the further three layers 7, 8 and 9 are placed one upon another to form a sandwich, so that when any one of the complete set of liquid crystal cells in a further member 7, 8 or 9 is energised the labelling thus presented will be seen through the transparent areas 2 in member 1. Member 7 has a plurality of liquid crystal cells 10 which together provide all the characters normally to be found in a typewriter. The liquid crystal cells 10 in member 8 provide different control command labels when energised. The liquid crystal cells 10 in member 9 together provide marker position labels. Each of the areas in further members 7, 8 and 9 which lie beneath areas 2a, 2b and 2c in member 1, are, of course, left blank. The liquid crystal cells in the different further members 7, 8 and 9 are energised by a source of voltage 11, when the rotor of a switch 12 is in an appropriate position. The rotor of switch 12 is controlled, as indicated by the dashed line 13, by a function sensing circuit 14, which derives an input over lead 15 from the three areas 2a, 2b and 2c of member 1. The function sensing circuit 14 is also connected to the read only memory store 4 in order to change the coding of the output of that store in dependence upon which of the areas 2a, 2b or 2c provides an input to the function sensing circuit 14.

The sandwich construction of members 1, 7, 8 and 9 is illuminated from beneath as indicated by the arrows 16. In this case reliance is placed upon the change in light transmission characteristics of liquid crystals material. The illumination could, of course, be from above reliance than being placed upon the changes in reflectivity of liquid crystals material.

In operation, assume that an operator wishes to use the device as a character generator i.e. to have the labels viewable through the transparent areas 2 of layer 1, those provided by further member 7. The operator touches area 2a of member 1 which provides a signal to function sensing circuit 14 such as to move the rotor of switch 12 to the position shown, thereby energising the liquid crystal cells in member 7, and such as to set read only store 4 such that it produces an output in response to an input from member 1 which output is coded in appropriate fashion having regard to the fact that the device is being used as a character generator. Should the operator wish now to provide a command signal, he uses probe 5 to touch area 2b which results in function sensing circuit 14 changing the rotor of switch 12 to its middle position, so as to energise the liquid crystal cells in further member 8 and again so as to appropriately alter the output coding provided by read only memory store 4 in response to input signals from member 1. Finally should an operator wish to provide marker position signals — for example to cause a marker on a display screen to take up a desired position — he touches area 2c with probe 5 which causes the liquid crystal cells 10 in further layer 9 to be energised and cause the read only memory store 4 to change its output coding to that appropriated to marker position signals.

I claim:

1. A programmable keyboard assembly comprising, in combination:

a first member presenting an array of discrete electrically conductive areas at least some of which are transparent and at least two other discrete areas;

a second member underlying said first member and presenting a second array of discrete areas which are aligned with those discrete areas of the first member which are transparent, said discrete areas of the second array thereof being in the form of liquid crystal effect labels;

a third member underlying said second member and presenting a third array of discrete areas which are aligned with said discrete areas of the first member which are transparent, said discrete areas of the third array thereof being in the form of liquid crystal effect labels;

means for energizing liquid crystal effect labels to render them visible to an observer;

switch means for selectively connecting said means for energizing to the liquid crystal effect labels of said second and third members;

actuator means connected to said two other discrete areas of said first member and to said switch means for actuating said switch means; and probe means selectively engageable with a chosen one of said two other discrete areas for relaying a signal to said actuator means so as to actuate said switch means and to cause it to energize the liquid crystal effect label array of that member associated with said chosen one of said two other discrete areas whereby a selected one of said second and third arrays is available for observation through said transparent areas.

2. An assembly as claimed in claim 1 and wherein said other discrete areas of said first mentioned member are opaque.

3. An assembly as claimed in claim 1 and wherein the members are provided as a sandwich construction, one on another.

4. An assembly as claimed in claim 1 and wherein means are provided for illuminating said members from the rear.

5. An assembly as claimed in claim 1 and wherein said discrete areas are rectangular and arranged in rows and columns.

6. A keyboard system for selectively displaying a selected one of a plurality of keyboard formats and for producing a coded output corresponding to a selected plurality of liquid crystal effect areas, comprising in combination:

a sandwich construction including a keyboard member having a plurality of discrete light transparent areas, and at least two keyboard format members successively underlying said keyboard member, each of said keyboard format members comprising a plurality of liquid crystal effect areas aligned with said discrete areas of the keyboard member, each liquid crystal effect area being transparent in the absence of energization thereof, the liquid crystal effect areas associated with a given keyboard format member displaying a corresponding keyboard format when such liquid crystal effect areas are energized;

switch means for selectively energizing the liquid crystal effect areas of said keyboard format member associated with said selected one of said keyboard formats whereby to display said selected one of said keyboard formats;

read only memory means connected with said keyboard member for storing coded outputs corresponding to said liquid crystal effect areas of each of said keyboard format members;

sensing means connected to said switch means for actuating said switch means selectively to energize the liquid crystal effect areas of said keyboard format member associated with said selected one of said keyboard formats, and connected to said read only memory means for producing a coded output corresponding to said liquid crystal effect areas selectively energized; and means for controlling said sensing means according to operator selection of said selected one of said keyboard formats and of a selected plurality of liquid crystal effect areas, whereby said selected one of said keyboard formats is displayed and a coded output corresponding to said selected plurality of liquid crystal effect areas is produced.

7. A keyboard system as defined in claim 6 wherein said means last mentioned comprises a pair of areas on said keyboard member adapted for selection by an operator.

8. A keyboard system as defined in claim 7 including an operator's probe for making selections at said keyboard member.

* * * * *